United States Patent [19]

Hansen et al.

[11] 4,379,727
[45] Apr. 12, 1983

[54] METHOD OF LASER ANNEALING OF SUBSURFACE ION IMPLANTED REGIONS

[75] Inventors: Howard H. Hansen, Underhill; Jerome B. Lasky; Ronald R. Silverman, both of Essex Junction, all of Vt.

[73] Assignee: International Business Machines Corporation, Armonk, N.Y.

[21] Appl. No.: 281,267

[22] Filed: Jul. 8, 1981

[51] Int. Cl.³ .................. H01L 21/263; H01L 21/265
[52] U.S. Cl. .................................. 148/1.5; 148/187; 357/71; 427/53.1
[58] Field of Search ............... 148/1.5, 187; 427/53.1; 357/71

[56] References Cited

U.S. PATENT DOCUMENTS

| | | | |
|---|---|---|---|
| 4,111,720 | 9/1978 | Michel et al. | 148/1.5 |
| 4,151,008 | 4/1979 | Kirkpatrick | 148/1.5 |
| 4,230,505 | 10/1980 | Wu et al. | 148/1.5 |
| 4,269,631 | 5/1981 | Anantha et al. | 148/1.5 |
| 4,318,752 | 3/1982 | Tien et al. | 148/1.5 |

OTHER PUBLICATIONS

Nakamura, J. Appl. Phys. 52 (1981) 1100.
Appl. Phys. Lett., Feb. 1, 1978, pp. 142–144, Gat & Gibbons.
Appl. Phys. Lett., Mar. 1, 1978, pp. 276–278, Gat & Gibbons.
Appl. Phys. Lett., Sep. 1978, pp. 389–391, Gat & Gibbons.
Solid State Tech. Journal, Nov. 1979, pp. 59–68, Gat et al.
Appl. Phys. Lett., Sep. 1978, pp. 542–544, Williams et al.
J. Appl. Phys., Apr. 1979, pp. 2926–2929, Gat et al.
IBM Tech. Disc. Bul., vol. 21, #10, Mar. 1979, p. 4040, R. F. Lever.

*Primary Examiner*—Upendra Roy
*Attorney, Agent, or Firm*—Francis J. Thornton

[57] ABSTRACT

A method for annealing ion implanted regions buried in a semiconductor substrate without the undesirable effects of thermal diffusion which includes the radiation of the substrate by a continuous laser having an emission frequency longer than 600 nanometers which the buried ion implanted regions will absorb strongly but which will be substantially unabsorbed by the unimplanted regions.

Superior results can be obtained when the substrate is heated to approximately 300° during this laser annealing.

9 Claims, 1 Drawing Figure

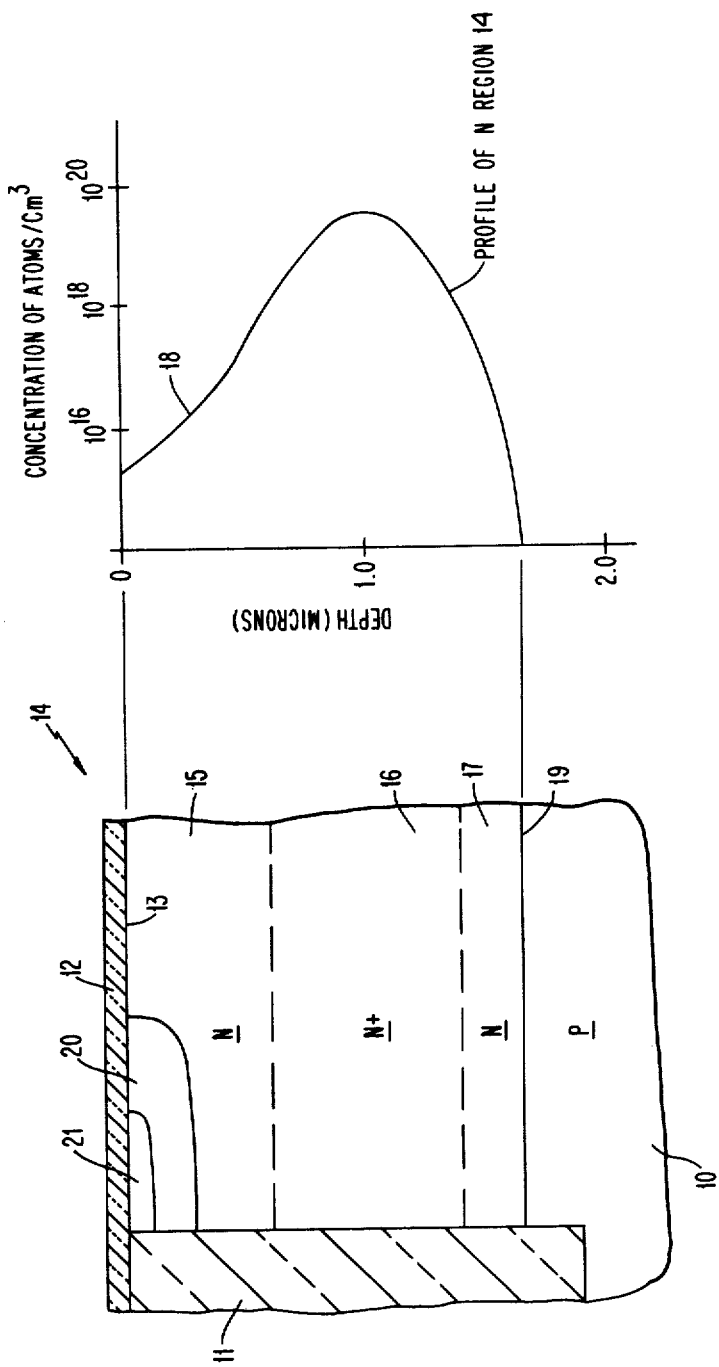

METHOD OF LASER ANNEALING OF SUBSURFACE ION IMPLANTED REGIONS

DESCRIPTION (1) Technical Field

The present invention relates to a method of annealing ion implanted regions buried in a semiconductor body by a radiation of the implanted region with a continuous wave laser having an emission frequency which the ion implanted regions will absorb strongly. The present invention may be particularly and advantageously used in the formation of vertical bipolar integrated circuits.

(2) Description of the Prior Art

Improved very high speed, high performance, integrated circuits, with low resistance collectors are now required by the electronic industry. To meet this need it has been necessary for the integrated circuit industry to utilize very precise ion implanted regions in non-epitaxial semiconductor bodies.

Typical high speed, high performance devices are taught in U.S. Pat. No. 4,111,720 to A. E. Michel et al, which is assigned to the same assignee as the present invention. This patent describes the formation of non-epitaxial, vertical, bipolar, integrated circuits involving ion implantation. In the formation of such circuits thermal annealing has been found to be undesirable for it causes substantial diffusion of the implanted ions which prevents the fabrication of sub-micron, bipolar devices with very precisely controlled sub-micron junctions. If precisely controlled junctions are not obtained the significant advantages which should be realizable from such non-epitaxial, vertical, bipolar, integrated circuits cannot be achieved.

With the development of laser annealing it was found that junctions lying less than 0.35 microns from the surface of the body can be annealed with a laser beam without substantial thermal diffusion of the implanted ions. Thus, precisely controlled junctions could be realized.

In the Applied Physics Letter, Feb. 1, 1978, pgs. 142–144, Gat and Gibbons teach that ion implantation annealing with substantially no thermal diffusion can be obtained for arsenic implanted regions at the surface of a semiconductor body by use of a continuous argon laser. In the Applied Physics Letter, Mar. 1, 1978, pgs. 276–278, the same authors, taught that the method of the above described reference provides 100% electrical activation of the implanted ions. Again, the same authors in the Applied Physics Letter of Sept. 1, 1978, pgs. 389–391, taught that continuous wave lasers, i.e., krypton, provide better control of diffusion profiles since no melting of the body occurs as previously found in pulsed systems.

However, in the Solid-State Technology Journal, dated November 1979, on pgs. 59–68, the author Gat, in conjunction with several others discussed the entire problem of continuous wave annealing and clearly taught on page 66, that deeply implanted ions, lying more than 0.35 microns from the surface of the device, cannot be annealed by laser techniques.

Other prior art which may be of interest can be found in the Applied Physics Letter, Sept. 15, 1978, pgs. 542–544, where Williams et al, teach that continuous wave laser annealing is probably due to solid state epitaxial regrowth of damaged silicon and that dwell times of continuous wave argon lasers on the order of milliseconds provide adequate time and temperature to allow regrowth without melting and associated thermal diffusion of the circuit.

Also of interest Gat et al, in the Journal of Applied Physics, April 1979, pgs. 2926–2929, taught that heated semiconductor bodies could be utilized during continuous wave, argon annealing and apparently relates the laser energy to that required to raise the anneal portion from its bulk temperature to that required for solid state epitaxial regrowth.

IBM Technical Disclosure Bulletin, Vol. 21, #10, March 1979, pg. 4040, also disclosed the use of the heated substrate during neodymimum laser annealing in order to provide more uniform absorption characteristics by the silicon substrate.

U.S. Pat. No. 4,151,008 is representative of a substantial amount of literature which teaches that a laser beam having a pulse duration on the order of one millisecond can be used for purposes of annealing surface areas of semiconductor devices.

However, although the prior art described the solution of a number of problems associated with laser annealing of semiconductor bodies none of them achieved the annealing, by laser technique, of implanted regions located more than 0.35 microns from the surface of the semiconductor body without altering the ion implantation curve.

SUMMARY OF THE PRESENT INVENTION

Accordingly, it is an object of the present invention to provide a method of annealing buried ion implanted regions in a semiconductor body without the undesirable effects of thermal diffusion of the implanted species. The method of the present invention includes irradiation of the implanted region by a continuous laser having an emission frequency at which ion implanted regions absorb strongly and at which the unimplanted regions are substantially unabsorbing.

It is another object of the present invention to provide an ion implantation method of forming and annealing ion implanted regions more than 0.35 microns from the surface of the semiconductor body. This annealing can be done by using continuous lasers whose emission wavelength is passed through the unimplanted portion of the body without any substantial absorption but is substantially absorbed in the buried implanted regions of the body. The absorption of the laser emission wavelength causes solid state regrowth and electrical activation of the implanted species in the implanted region without substantial thermal diffusion of the implanted species.

It is still another object of the present invention to provide a laser annealing method for ion implanted regions in a semiconductor body without melting or deleteriously altering of the structure of the surface layers of the semiconductor body being annealed.

The above and other objects of the present invention are achieved by a method of forming and annealing deep buried ion implanted regions in a semiconductor body comprising ion implanting impurity ions into a crystalline semiconductor body to provide a buried region having a high concentration of the impurity ions at a predetermined depth below the surface of the body, and annealing the buried region by exposure to the light emitted by a continuous laser having an emission frequency to which the unimplanted body is substantially transparent but which is substantially absorbed by the buried region.

The method of the present invention may be advantageously employed in the production of vertical bipolar integrated circuits.

The foregoing and other objects features advantages of the invention will be apparent from the following more particular description of the preferred embodiment of the invention as illustrated in the accompanying drawing.

BRIEF DESCRIPTION OF THE DRAWINGS

FIG. 1 is a large cross-sectional partial view of an ion implanted region in a semiconductor body that can be treated by the present invention together with a curve showing the distribution, that is the concentration variational depth, of the impurities forming the implanted region.

DESCRIPTION OF THE PREFERRED EMBODIMENT

Selected oxide isolation regions 11, of which only one is shown, are formed in a silicon body 10 comprised of p-type material and having a resistivity in the order of 10 ohm-centimeters. The oxide region 11 preferably extends into the body up to 5 microns. The formation of such isolation regions 11 is well known to the semiconductor art and basically employs etching and thermal oxidation techniques. Simultaneously an oxide layer 12, also, may be formed on the entire surface 13 of the body 10. Again the formation of such oxidation techniques are well known to the semiconductor industry.

Following formation of the layer 12, the body 10 is subjected to a blanket ion implantation of phosphorous ions at an energy level of, for example, 400 keV and a dosage of 1 to $5 \times 10^{15}$ centimeter$^2$. This ion implantation step is carried out using standard ion implantation techniques well known to the art. This ion implantation step creates an n-type surface region 14 in the body having an impurity distribution of the implanted ion as indicated by the curve 18. The distribution of the implanted ions in the region 14 basically comprises a gaussian curve having an extended tail reaching toward the surface 13. The region 14 may be roughly characterized into three regions 15, 16 and 17. The most highly doped region 16 is usually located from 0.5 to 5.0 microns below the surface 13 and contains the peak concentration of ions which is approximately $10^{20}$ atoms per centimeter$^3$. However, the peak concentration could range from $10^{15}$ to $10^{21}$ atoms per centimeter$^3$. The regions 15 and 17 bounding region 16 both contain a lesser concentration of ions than does region 16. Region 15 is terminated by the surface 13 and region 17 is terminated by the p-n junction 19.

As is well known such ion implantation causes damage in the semiconductor lattice. This damage must be annealed out of the semiconductor lattice and the implanted ions themselves moved into substitutional positions in the lattice where they are electrically active. To achieve this desired result the following method is employed. The body 10 is heated to about 300° C. After the body reaches this temperature, the body is exposed to the emission spectra of a laser having an emission wavelength larger than 600 nanometers. Specifically, a continuous neodynimum: Yittrium Aluminum Garnet (Nd:Yag) laser, operating at a wavelength of 1.06 microns, meets this requirement and was used in the actual experiments. The laser beam impinging on the body, shown in FIG. 1, passes without effect through the oxide layer 12 which is transparent to the light emitted by this laser. As the laser beam penetrates the underlying region 14 it becomes absorbed by the damage sites within the semiconductor lattice. This absorption of the light heats the region, anneals the damage and causes the implanted dopant ions in the vicinity to become electrically active by causing the ions to move into electrically active substitutional positions in the lattice. This occurs without causing melting of the lattice.

The distribution of damage in the implanted region can, for all practical purposes, be considered to have the same distribution as the implanted regions. Thus, the energy of the laser beam will be most strongly absorbed in the heavily implanted region 16 and less strongly absorbed in the more lightly implanted regions 15 and 17.

It has been found that heating of the semiconductor wafer to about 300° C. eliminates the effect of any instability in the laser beam and prevents damage to the wafer such as slip dislocation. This heating results in this improvement because it reduces the effect of two deleterious mechanisms which are present in all continuous wave neodymium-YAG annealing, that is, the decreasing thermal conductivity of the silicon as the substrate temperature increases and the increasing absorption coefficient of the silicon with increasing temperature.

Initial analysis of devices treated in accordance with the above described invention shows that there are no structural defects within the first quarter of a micron of the region 14 in which the impurity concentration is less than $2 \times 10^{19}$ ions per centimeter$^3$. Continuing research indicates that the defect free region extends considerably deeper. This indicates that the laser treatment in accordance with the invention does not cause melting or the other adverse effects associated with the laser annealing treatments disclosed by the prior art discussed above.

Any of the laser emission spectra unabsorbed by the implanted region passes through to the substrate 10 and is only weakly absorbed causing little effect.

Following this laser annealing step base and emitter base regions 20 and 21 can be formed within the surface region 15 using additional ion implantation techniques. Specifically arsenic ions can be implanted at 25 keV to a level of 8 times $10^{15}$ ions per centimeter$^2$ to create an emitter following which boron ions also at an energy level of 25 keV and a density of 4 times $10^{13}$ ions per centimeter$^2$ can be deposited to create the base region. The implantation and activation of the implanted ions in the emitter and base region results in the formation of a bipolar integrated circuit as taught in U.S. Pat. No. 4,111,720.

While the specific example has been described with respect to a npn type transistor it will be obvious that pnp transistors and complementary transistors can also be formed.

While the invention has been particularly shown and described with reference to the preferred embodiments thereof it would be understood by those skilled in the art that various changes in form and detail may be made therein without departing from the spirit and scope of the invention.

What is claimed is:

1. A method of annealing buried ion implanted regions in a semiconductor body comprising;

ion implanting impurity ions into a crystalline semiconductor body to provide in the body a buried region having a high concentration of said impurity ions at a predetermined depth below the surface, and annealing said buried region by exposure of the body to the emission of a continuous wave laser having an emission frequency which is substantially absorbed by the buried region and to which the remainder of the body is substantially transparent to cause electrical activation of the implanted ions in said buried region without substantial thermal diffusion of the implanted species.

2. The method of claim 1 wherein there is further provided the step of heating the body to approximately 300+ C. during exposure of the body to said laser to eliminate the effect of any instability in the laser beam and prevent damage to said body.

3. The method of claim 1 wherein said body comprises silicon and said implanted ions are phosphorous ions implanted at an energy level of 400 keV with a dosage of 1 to $5 \times 10^{15}$ centimeter$^2$.

4. The method of claim 2 wherein said emission frequency of said laser is larger than 600 nanometers.

5. The method of claim 1 wherein said laser is a Yittrium Aluminum Garnet continuous wave laser operating at a wavelength of 1.06 microns.

6. The method of claim 4 wherein said buried region lies between 0.5 microns and 5.0 microns below the surface of a body and the peak concentration of implanted ions in said body ranges from $10^{15}$ to $10^{20}$ ions per centimeter$^3$.

7. The method of claim 2 wherein there is further provided after said annealing step the steps of ion implanting a base region and an emitter region in said buried region.

8. A method of annealing buried ion implantated regions in a semiconductor body without undesirable effects of thermal diffusion of said implanted region by a continuous laser having an emission frequency at which said ion implanted regions absorb strongly and at which the unimplanted regions are substantially unabsorbed to cause electrical activation of the implanted ions in said region without substantial thermal diffusion of the implanted ions and heating the body to approximately 300° C. during exposure of the body to said laser to eliminate the effects of any instability in said laser.

9. A method of forming and annealing deep buried ion implanted regions in a semiconductor body comprising;

ion implanting impurity ions into a crystalline semiconductor body to provide a buried region having its highest concentration of impurity ions at a predetermined depth of at least 0.35 microns below the surface of the body, and annealing the buried region by exposure of said body to the light emitted by a continuous wave laser having an emission frequency greater than 600 nanometers to which the unimplanted body is substantially transparent but which is substantially absorbed by the buried region.

* * * * *